United States Patent [19]

Maestri et al.

[11] Patent Number: 6,066,231
[45] Date of Patent: May 23, 2000

[54] LAMINATING DEVICE FOR JOINING A METAL STRIP AND AN INSULATING MATERIAL STRIP

[75] Inventors: Daniel Maestri, Sanssac L'Eglise; Eric Eymard, Siaugues-Sainte-Marie, both of France

[73] Assignee: Pem S.A. Protection Electrolytique des Metaux, France

[21] Appl. No.: 08/945,683

[22] PCT Filed: Apr. 22, 1996

[86] PCT No.: PCT/FR96/00607

§ 371 Date: Oct. 21, 1997

§ 102(e) Date: Oct. 21, 1997

[87] PCT Pub. No.: WO96/34361

PCT Pub. Date: Oct. 31, 1996

[30] Foreign Application Priority Data

Apr. 25, 1995 [FR] France ................................ 95.05310

[51] Int. Cl.[7] .............................. B32B 31/18; B32B 31/20
[52] U.S. Cl. .................. 156/379.8; 156/511; 156/513; 156/519; 156/252; 156/257; 156/263; 156/273.9; 29/831; 29/465
[58] Field of Search ...................... 156/257, 264, 156/266, 379.8, 514, 517, 519; 29/412, 413, 464, 465, 466; 270/58.27, 52.08; 100/151; 242/526; 198/345.1, 690.2, 626.2, 626.3

[56] References Cited

U.S. PATENT DOCUMENTS

| 3,481,817 | 12/1969 | Mutter et al. ................. 198/626.2 X |
| 4,264,397 | 4/1981 | Kawashima et al. .................... 156/361 |
| 4,285,754 | 8/1981 | DiMatteo ................. 156/264 |
| 4,295,912 | 10/1981 | Burns ....................... 156/324 |
| 4,481,397 | 11/1984 | Maurice et al. ................. 219/10.61 R |
| 4,531,270 | 7/1985 | Griffith et al. ......................... 29/412 X |
| 4,741,090 | 5/1988 | Monnier ..................... 29/464 |
| 4,793,052 | 12/1988 | Ammann et al. ........................ 29/559 |
| 5,022,336 | 6/1991 | Iwase ....................... 112/304 |
| 5,023,751 | 6/1991 | Stampfli ........................ 361/398 |
| 5,028,040 | 7/1991 | Kalisiak ............................... 270/52.08 |
| 5,231,756 | 8/1993 | Tokita et al. .............................. 29/830 |
| 5,768,772 | 6/1998 | Buechele ................. 29/464 X |
| 5,862,583 | 1/1999 | Ammann et al. ..................... 29/464 X |

FOREIGN PATENT DOCUMENTS

| 0296511 | of 1988 | European Pat. Off. . |
| 2379909 | of 1978 | France . |
| 2031796 | of 1980 | United Kingdom . |
| 92/15118 | of 1992 | WIPO . |

*Primary Examiner*—Jeff H. Aftergut
*Assistant Examiner*—Michael A Tolin
*Attorney, Agent, or Firm*—Wall Marjama Bilinski & Burr

[57] ABSTRACT

Apparatus for bonding an insulating material to a metal strip having a conveyor for moving a strip of insulting material along a path of travel and a mechanism for placing perforations in the strip and cutting the strip into sections of predetermined length. The conveyor has raised registration studs that pass through the perforations. A metal strip that also contains perforations is brought into moving contact with the section with its perforation being registered on said studs and a heat curable bonding material is introduced between the metal strip and the insulation sections. A second conveyor is then moved into pressure contact with the moving sections and metal strip registered on the first conveyor and heat is applied to cure the bonding material.

9 Claims, 5 Drawing Sheets

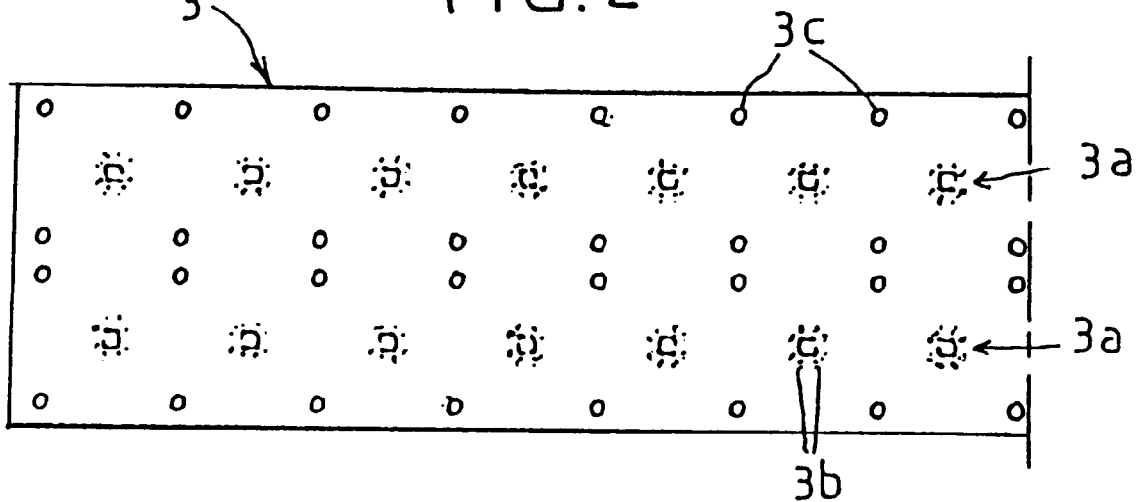
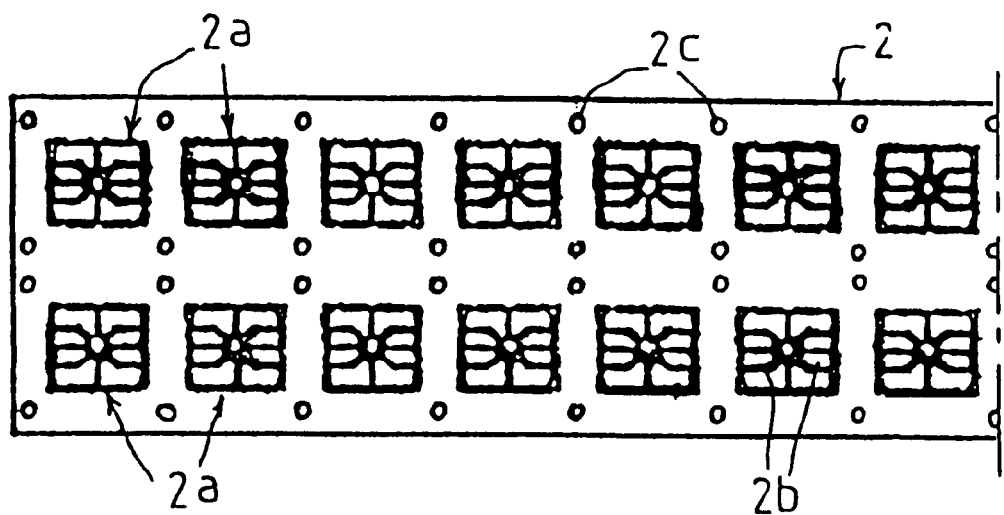

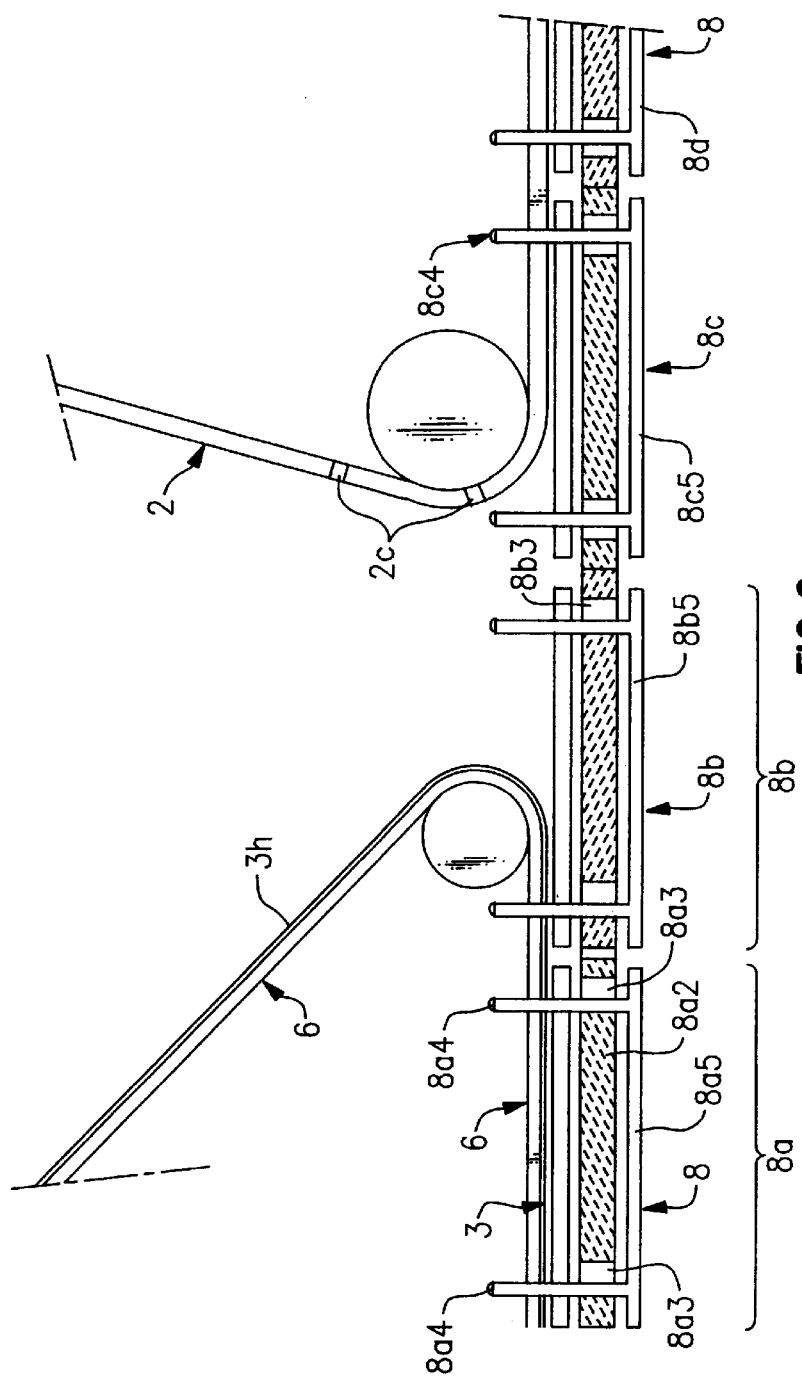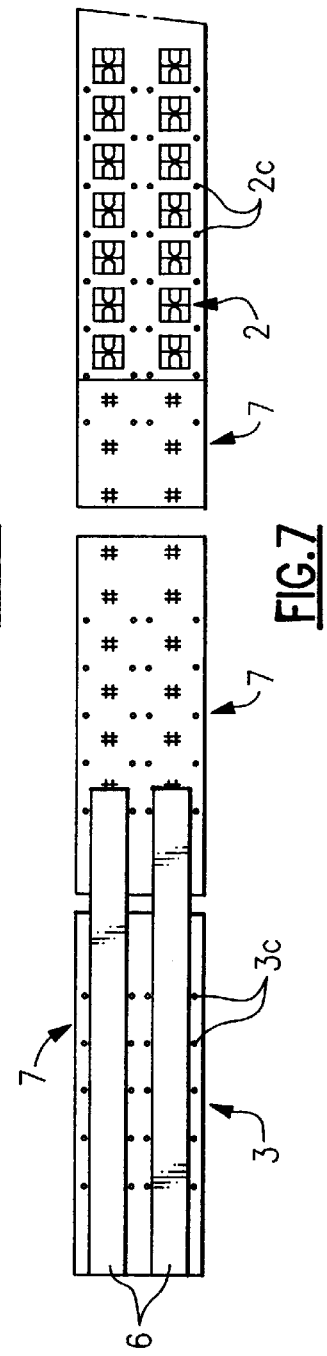

LAMINATING DEVICE FOR JOINING A METAL STRIP AND AN INSULATING MATERIAL STRIP

BACKGROUND OF THE INVENTION

The invention described herein relates to a device for bonding two different materials. Applications include chip card manufacturing and, more precisely, the manufacture of the chip base such chip cards contain.

Chip card use is on the increase, notably in the digital payment field with bank and phone cards.

It is common knowledge that a chip card consists of a stiff plastic card with a hole, generally located in one of its corners. The hole receives an assembly of a base and an electronic component, commonly called a "chip". The chip base itself is usually made of two component parts, viz. a perforated metal part called a grid and an insulating part. The grid acts as a connecting interface with the chip. The grid is divided in separate areas or connectors, each designed to enter into contact with a pin of the machine the card is inserted in. The opposite side of the grid is covered with an insulating film with a certain number of perforations. Each perforation is precisely positioned on an area of the grid. It is thus possible to connect each grid connector with an area of the chip using metal but usually gold wire.

To automate the manufacturing process, highly precise positioning is required to match the perforations in the insulating layer to the metal grid.

As a rule, grids are produced on long strips onto which the insulating layer, a strip of equivalent width, is hot-bonded. Unfortunately, as materials differ, grid and perforation intervals are not rigorously the same. This precludes the manufacture of very long strips, unless patterns are realigned.

The problem quite clearly stands in the way of automatically producing very long strips.

In an attempt to solve the problem, a complex machine has been proposed that operates on the following principle. On a uniform length of metal strip on which grids are located at given intervals, an insulating strip with perforations located at slightly narrower intervals is placed. The insulating film is stretched over the uniform length of metal strip in such a manner as to match the perforations in the insulating strip with those constituting the grids. Stretch is controlled by a match-detecting camera system. When perfectly positioned, the insulating layer is applied and bonded to the metal strip. Though producing satisfactory results, the device, operating in a sequential manner, is not suited for mass production.

This state of the art may be illustrated by the contents of patents GB-A-2 031 796 and WO-A-92 15118.

To solve the problem of matching the insulating strip perforations to those in the metal strip, a solution has been proposed in conformance with patent EP-A-0 296 511. The patent describes a device in which perforated sheets of insulating material are placed on and bonded to a metal strip in a manner that matches the perforations in the insulating material to those in the metal strip. According to the device disclosed in the patent, each sheet is placed on and subsequently bonded to the metal strip with no micro-alignment between the positioning and bonding operations.

The problem the invention aims to solve, therefore, is that of making a bonding device that will attach a metal strip with periodic perforations to a strip of insulating material with perforations spaced at like intervals. To solve the problem, a device has been conceived and developed comprising:

- a system to perforate the insulating strip at regular intervals on the one hand and cut said insulating strip in sections, on the other;
- a system to position the metal strip onto said sections of insulating strip and a system to convey the metal strip positioned onto said sections of insulating strip;
- a system to micro-align each section relative to the metal strip onto which the section has been placed to match the perforations of each strip with great precision;
- a system for bonding each section of insulating strip to the metal strip.

Given this combination of systems, it is clear that the device simultaneously moves the metal strip and positions each section relative to said strip to rigorously match the perforations. As centring and conveying operations are concomitant, bonding is a continuous process requiring neither stopping nor adjustment sequence.

SUMMARY OF THE INVENTION

To solve the problem of conveying the sections of insulating film, the system cutting the insulating strip in sections consists of:

- a system for precutting the sections;
- a system for affixing at least one length of adhesive tape as a function of strip length at least onto the precut areas;
- a system for severing the areas not precut to obtain separate sections, temporarily linked by at least one length of adhesive tape.

The film, therefore, is cut into a number of sections which are subsequently linked by adhesive tape to form a continuous series of sections easy to convey.

The cutting device is separated from the bonding device proper.

To solve the conveying problem, a positioning and conveying system is made up of a chain of mutually articulated links wide enough to receive the insulating and the metal strips, each link being slightly longer than the section of insulating strip and equipped with feed studs.

Each film section is carried along by a single link.

To solve the important problem of matching the perforations of each section to those of the metal strip, the system used to perform micro-alignments of each section in relation to the metal strip consists of:

- a main platform designed to carry cutout sections acting as the top of each link;
- a plate within the link body, set back from the platform and movable parallel with the length of the strip and equipped with feed studs, said studs protruding through the holes of a greater diameter in the platform.

It clearly appears that the feed studs are integral with a plate that can move in relation to the drive chain. Thus, as each section is moved along by the plate when the studs convey the metal strip, the section is automatically and mechanically centered onto the matching part of the metal strip.

Advantageously, and so as to make conveying strips of differing characteristics possible, notably as regards the position of the feed holes, the platform and the movable plate are a removable chain link sub-assembly.

As regards the assembly of the film and the metal strip, the system notably uses induction heating to bond the two superposed strips.

Advantageously, the bonding system includes:

- a chain of press plates moved along at the same speed as the conveying chain, each of the press plates having the same dimensions as the platforms it faces and touches;

two sets of inductors facing each other, the lower set being located slightly below the trajectory of the conveyor platforms and the upper set being located slightly above the trajectory of the press plates, in such a manner that energizing the inductors will set up a current across the facing metal plate.

To solve the problem of local hot spots causing irregular bonding, each press plate has a metal area designed to face the metal strip and diffuse the heat, rendering the temperature of the surface to be bonded uniform.

BRIEF DESCRIPTION OF THE DRAWINGS

In order that the present invention may be more readily understood, the following drawings are provided, viz., FIG. 1, a schematic drawing of the invention, FIGS. 2 and 3, top views of respectively the insulating and the metal strip before bonding, FIG. 4, a schematic drawing of insulating strip cutting station, while FIG. 5 shows its progress through the cutting process, FIG. 6, a schematic drawing of the chain conveying the two strips, while FIG. 7 shows its evolution in each stage, FIG. 8, a cross section of a conveyor chain link.

DESCRIPTION OF THE INVENTION

Figure 1:
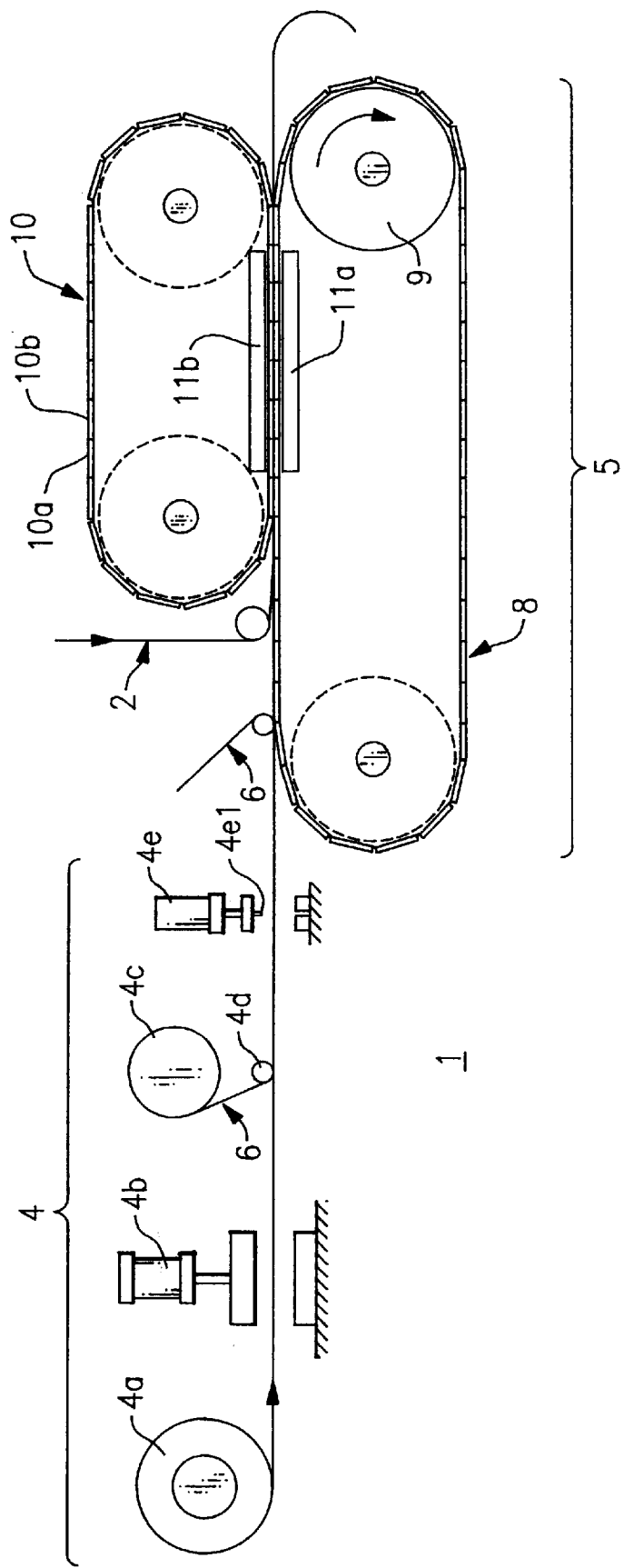

As stated, the device is advantageously applied for bonding a metal strip to a strip of insulating material.

The metal strip (2) as illustrated in FIG. 3, generally of copper or bronze, is approximately 35 millimeters wide. It has two rows of identical patterns (2.*a*) used to form the grids. It goes without saying that the variety of patterns is wide (square, round, etc.), as are the cutout shapes that are determined by the function the card is to fulfil. As a rule, patterns have 8 cutout areas (2.*b*) located at uniform distances from each other (the distance between each double pattern being the pitch).

The insulating film (3) comes in the shape of a strip of the same width (see FIG. 2). It is made of polyimide, a product sold under the Kapton® brand by Du Pont de Nemours corporation. It has two rows of groups (3.*a*) of perforations (3.*b*) patterned to match the grid areas (2.*a*) of the metal strip (2). One of the sides of this strip receives a layer of hot-melt glue. This layer of glue is covered with a polyester protective foil (3.*h*) as commercially available from the same supplier under the Mylar® brand.

The two strips feature the same perforations (2.*c*, 3.*c*) for feed-through and centring. As regards their positional variation, it is considered that the insulating strip has a tolerance of two hundredths of a millimeter over an 8-pitch equivalent length as the punching tool is designed to operate on 8 pitches simultaneously, whereas the metal strip has the same tolerance but in cumulated pitches.

The machine shown in FIG. 1 consists of two wholly separate sub-assemblies, viz., a cutout station (4) and a conveyor/bonding chain (5).

Figure 4:
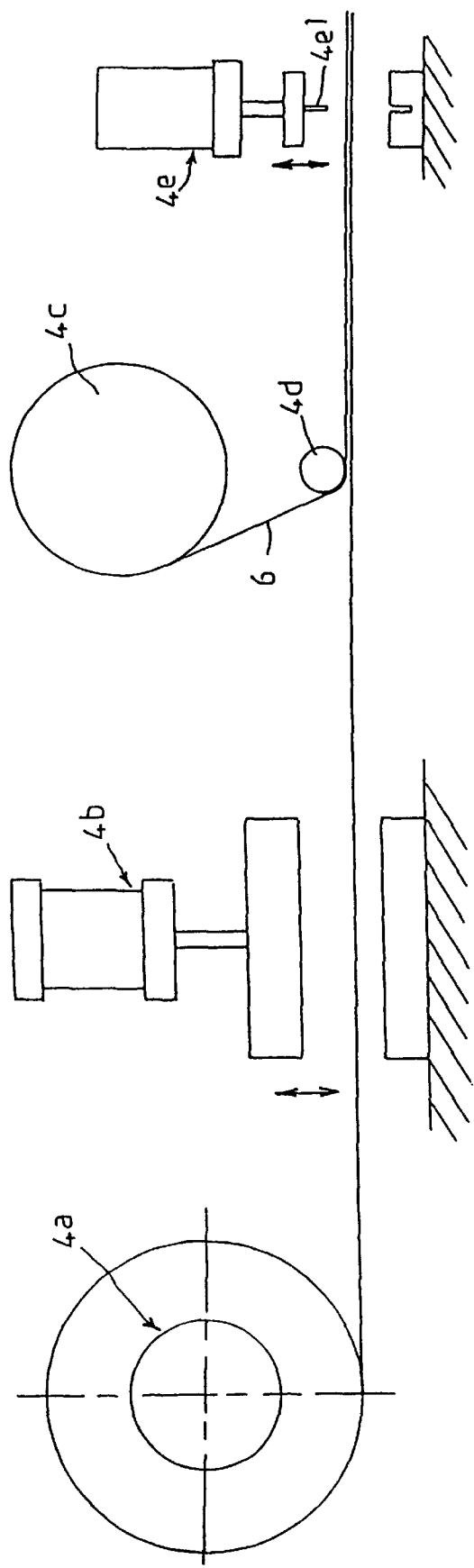

The cutout station (4), shown in FIG. 4, is in order of film feed-through equipped with a feed-out unit (4.*a*) unwinding and dispensing a roll of insulating film covered by protective foil, a punching tool (4.*b*) to perforate and precut the Kapton, a feed-out unit (4.*c*) of adhesive tape and a pressure roller (4.*d*) and a tape cutter (4.*e*) to sever precut sections.

Figure 5:
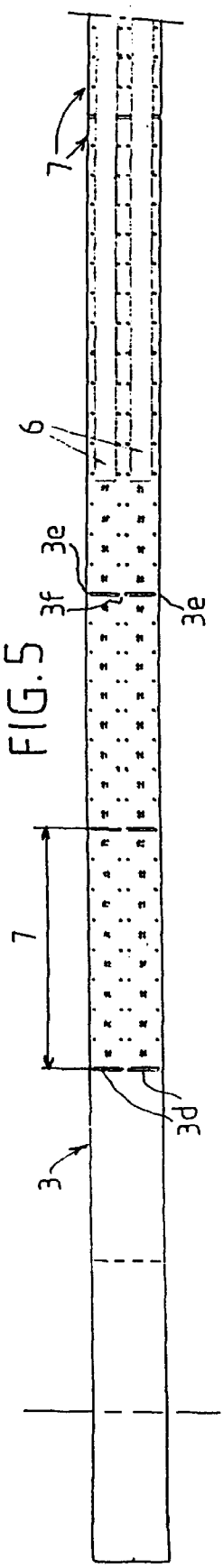

As can be seen from FIG. 5, the punching tool (4.*b*) in addition to perforating the Kapton, punches two lines (3*d*) across the insulating strip. Sections are held together at only three points, viz. the middle (3.*f*), the beginning and the end of the cross-cut (3.*e*). Cross-cuts separate 8-pitch units (7).

The punching tool perforating and precutting the strip is followed by the taping station (4.*c*, 4.*d*) which affixes two lengths of adhesive tape (6) to the center of the cross-cut (3.*d*) without covering the feed-through holes (3.*c*) or the parts not precut (3.*e*, 3.*f*).

And lastly, cutout is completed by a final severing operation (4.*e*). This is performed by a cutter (4.*e*.1) with three knives located over the central (3.*f*) and end (3.*e*) parts of the strip. It goes without saying that final cutout width is controlled to prevent damage to the lengths of adhesive tape (6).

To sum up, the cutout station feeds out a succession of single sections (7) held together by two lengths of adhesive tape (6). The strip, therefore, is a compound one that can be conveyed.

FIG. 6 shows one of the invention's principal characteristics, i.e., the combined conveying and centring system. The system is based on a chain (8) of articulated links. It is driven by a crown wheel (9). Each link (8.*a*) in addition to rolling gear (8.*a*.1) has a main platform (8.*a*.2), which receives the insulating strip (3). This platform has at least 4 holes (8.*a*.3). Four feed studs (8.*a*.4) protrude up through these holes. These four studs are integral with a movable plate (8.*a*.5) set back from the platform (8.*a*.2). This plate can move in a parallel plane with the platform.

As can be seen from FIG. 6, the first links (8.*a*, 8.*b*) of the chain move the insulating strip (3) forward. Strip tension causes the movable plates (8.*a*.5, 8.*b*.5) to be pulled back to their home position at the rear of the feed stud holes (8.*a*.3, 8.*b*.3). Due to the adhesive tape (6), the next section can be pulled through.

As indicated, the insulating strip is covered by a film (3.*h*) protecting the glue. Prior to removing the metal strip, the Mylar® film and the lengths of adhesive tape (6) are separated and wound for future use. From that moment on, the section under consideration (7) is free and subject to no drive strain.

When the next link (8.*c*) presents itself, the metal strip is placed over the link carrying an insulating section. The feed studs (8.*c*.4), traversing the metal strip through the appropriate holes (2.*c*), move the metal strip (2) along. As a consequence, the movable plate (8.*c*.5) moves in such a manner that the feed studs (8.*c*.4) align the feed holes (2.*c*) in the metal strip with those (3.*c*) of the section concerned.

As can be seen from FIG. 6, the movable plate (8.*c*.5) moves forward in relation to its matching link (8.*c*). Perforations are thus perfectly matched across 8-pitch sections. At the end of this stage, each link (8.*d*) carries a part of the metal strip on top of a perfectly positioned section of insulating film.

Bonding proper takes place somewhat later. The operation requires a second chain (10), called the press chain. It consists of links (10.*a*, 10.*b*) of the same size as the conveyor links. It is designed to apply a certain pressure to the strips during heating.

Figure 8:
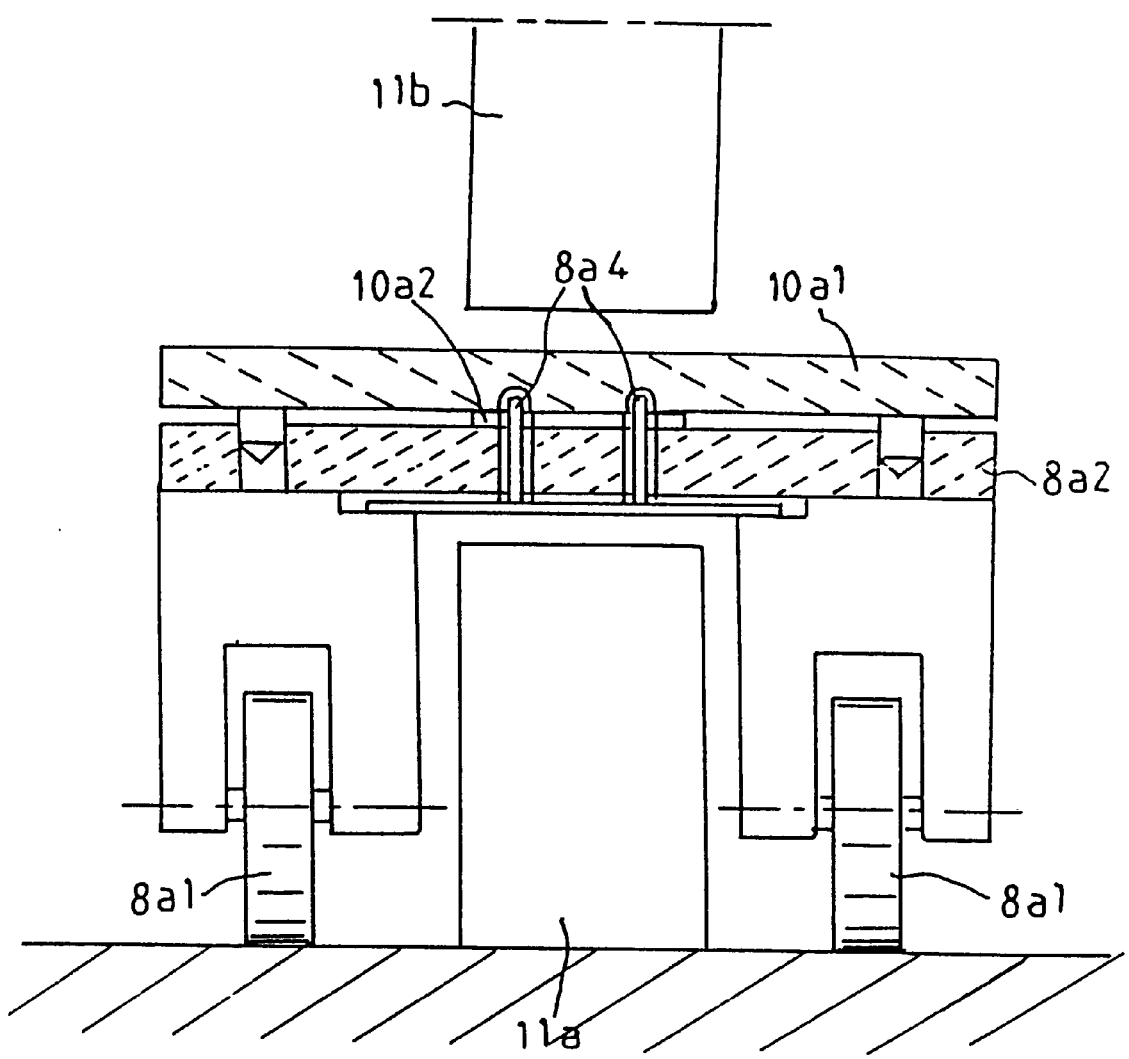

The heating system consists of two inductor sets (11.*a*, 11.*b*) located as near to the platforms (8.*a*.2, 10.*a*.1) as possible. As can be seen from FIG. 8, the links are shaped as an up-ended U-channel with the platform (8.*a*.2) as its base and the rolling gear (8.*a*.1) as its legs. The inductors (11.*a*) penetrate the inter-leg space and face the platform (8.*a*.2).

The links of the upper chain are made up of a press plate (10.*a*.1) used to press the metal strip to the insulating section. The part of the press plate in contact with the metal strip is an integral metal pad (10.*a*.2).

Energizing the inductors (11.*a*, 11.*b*) causes eddy currents to flow in the metal strip (2) and produce heat. The consecutive temperature rise causes the layer of glue on the insulating film (3) to melt, bonding the two strips. As a result of the cutouts (2.*b*) in the metal strip, currents induced are poorly distributed. This is why a metal pad (10.*a*.2) is applied: acting as a diffuser, it equalizes the temperature, ensuring uniform bonding.

The preceding description concerns only one particular embodiment of the invention. The use of similar means would still be covered by the same invention. The use of cutting tools mechanically linked to drive mechanisms or used wholly separately would be a case in point.

It results from the above that the device according to the invention, contrary to existing systems, combines high precision in manufacturing bonded strips with the continuous operation of manufacturing lines.

What is claimed is:

1. A machine for continuously and automatically bonding a metal strip to an insulating material, said machine comprising:

a metal strip having longitudinally spaced apart perforations and aligning holes formed therein;

a conveyor means for continuously moving a strip of insulating material along a linear path of travel;

perforating means positioned along said path of travel for continuously forming perforations and aligning holes in said insulating strip that are in the same alignment as the perforations and aligning holes formed in said metal strip;

cut-off means for cutting the insulating strip into sections as the strip continuously moves along said path of travel, each section containing at least two aligning holes;

registration means mounted upon said conveyor containing pins that are capable of passing through said aligning holes contained in said sections;

positioning means for moving said metal strip into registration with said sections so that said pins are further passed through the aligning holes in said metal strip whereby the perforations in said metal strip are located in registration with the perforations in said insulation sections; and bonding means for attaching the insulation sections to the metal strip while the sections are maintained in registration upon said pins.

2. The apparatus of claim 1, wherein said cut off means further includes:

first means for precutting areas of the insulating strip so that adjacent sections of the strip are co-joined by narrow non-cut areas;

second means down stream from said first means for affixing length of adhesive tape over the precut areas so that adjacent sections are further co-joined by said tape; and third means downstream from said second means for severing the non-cut areas between the sections whereby adjacent sections are co-joined by said tape.

3. The apparatus of claim 1 wherein said registration means includes articulated links having a length and a width sufficient to support an insulation section and the metal strip thereon and wherein said links contain said pins.

4. The apparatus of claim 3, wherein each link further includes:

a platform for carrying a section;

a plate situated within said link that is spaced apart from the platform and movable therewith along the path of travel;

and said pins protruding from said plate through said platform.

5. The apparatus of claim 4, wherein said platform and said plate are removably mounted upon said link.

6. The apparatus of claim 1, wherein said bonding means for attaching the insulation sections to the metal strip includes holddown means for holding the sections and said strip in contact, an adhesive means, and heating means for heating the contact area to activate said adhesive.

7. The apparatus of claim 6, wherein said heating means is an induction heater.

8. The apparatus of claim 6, wherein said holddown means further includes an endless chain for moving a series of press plates into contact with the registered insulation section and the metal strip along said path of travel so that the strip and the sections are urged into contact by the press plates and said heating means includes opposed heat inductors, one of which is mounted adjacent said conveyor and the other adjacent the endless chain.

9. The apparatus of claim 8, wherein each press plate includes a metal plate that rides in contact with the metal strips during bonding to diffuse heat.

\* \* \* \* \*